United States Patent
Kim et al.

(10) Patent No.: US 8,743,560 B2
(45) Date of Patent: Jun. 3, 2014

(54) CIRCUIT BOARD AND SEMICONDUCTOR MODULE INCLUDING THE SAME

(75) Inventors: Yonghoon Kim, Suwon-si (KR); Hyunki Kim, Cheonan-si (KR); Heeseok Lee, Yongin-si (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 153 days.

(21) Appl. No.: 13/198,224

(22) Filed: Aug. 4, 2011

(65) Prior Publication Data
US 2012/0063108 A1  Mar. 15, 2012

(30) Foreign Application Priority Data
Sep. 10, 2010 (KR) .................. 10-2010-0089045

(51) Int. Cl.
*H05K 7/00* (2006.01)
*H05K 1/18* (2006.01)
(52) U.S. Cl.
USPC ........... 361/783; 361/761; 361/763; 361/764; 174/255; 174/260
(58) Field of Classification Search
USPC ........... 361/761, 763, 764, 783, 301.1, 301.4; 174/255, 260
See application file for complete search history.

(56) References Cited

U.S. PATENT DOCUMENTS

| | | | |
|---|---|---|---|
| 5,574,620 A * | 11/1996 | Grimm et al. | 361/282 |
| 7,583,512 B2 * | 9/2009 | Ryu et al. | 361/765 |
| 7,690,109 B2 | 4/2010 | Mori et al. | |
| 7,969,745 B2 * | 6/2011 | Hsu et al. | 361/761 |
| 2008/0257480 A1 | 10/2008 | Nakamura | |
| 2008/0257590 A1 * | 10/2008 | Ho et al. | 174/255 |
| 2009/0207574 A1 * | 8/2009 | Chen et al. | 361/761 |

FOREIGN PATENT DOCUMENTS

| | | |
|---|---|---|
| JP | 2005-026670 | 1/2005 |
| JP | 2006-147607 | 6/2006 |
| KR | 10-2004-0096537 A | 11/2004 |
| KR | 10-2007-0042560 A | 4/2007 |

* cited by examiner

*Primary Examiner* — Jayprakash N Gandhi
*Assistant Examiner* — Dion Ferguson
(74) *Attorney, Agent, or Firm* — Muir Patent Consulting, PLLC

(57) ABSTRACT

In one embodiment, a circuit board is disclosed. The circuit board includes a first metal core; a second metal core spaced apart from the first metal core in a first direction when viewed as a cross section, such that a first side of the first metal core faces a first side of the second metal core; a first electrode electrically connected to the first side of the first metal core; a second electrode electrically connected to the first side of the second metal core facing the first metal core; and a dielectric layer between the first and second electrodes.

18 Claims, 18 Drawing Sheets

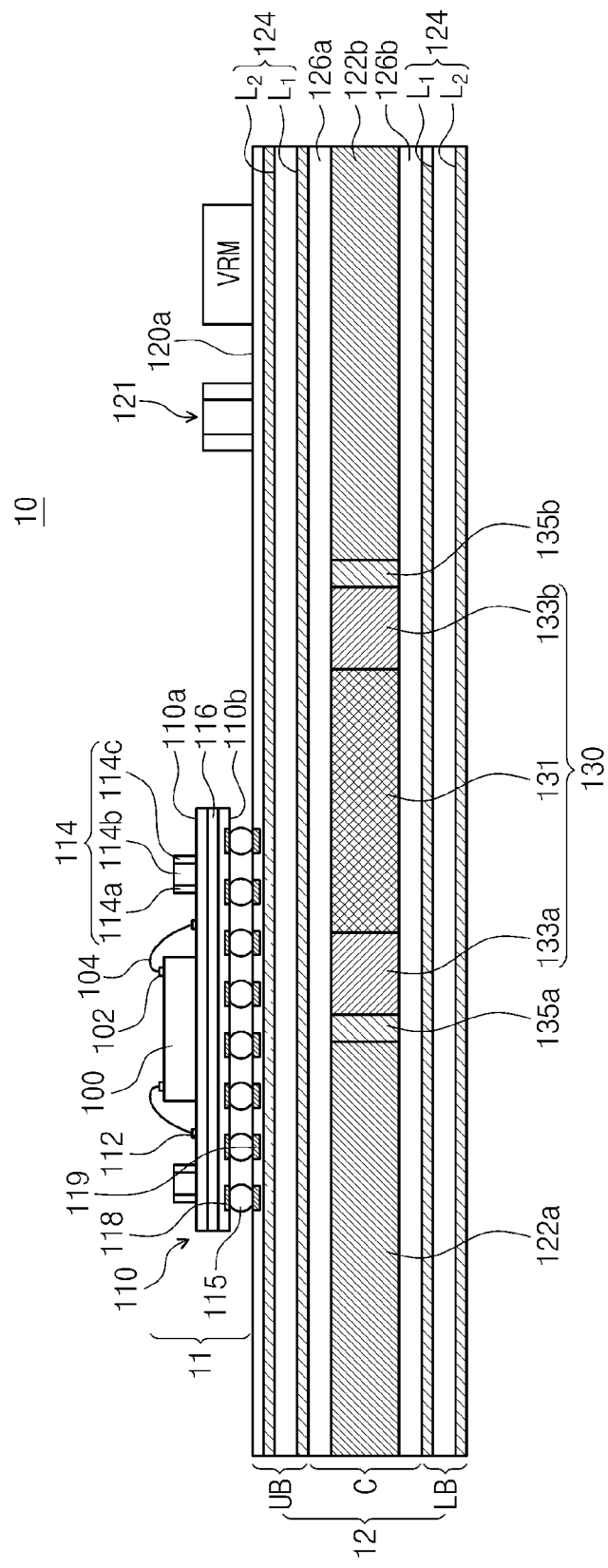

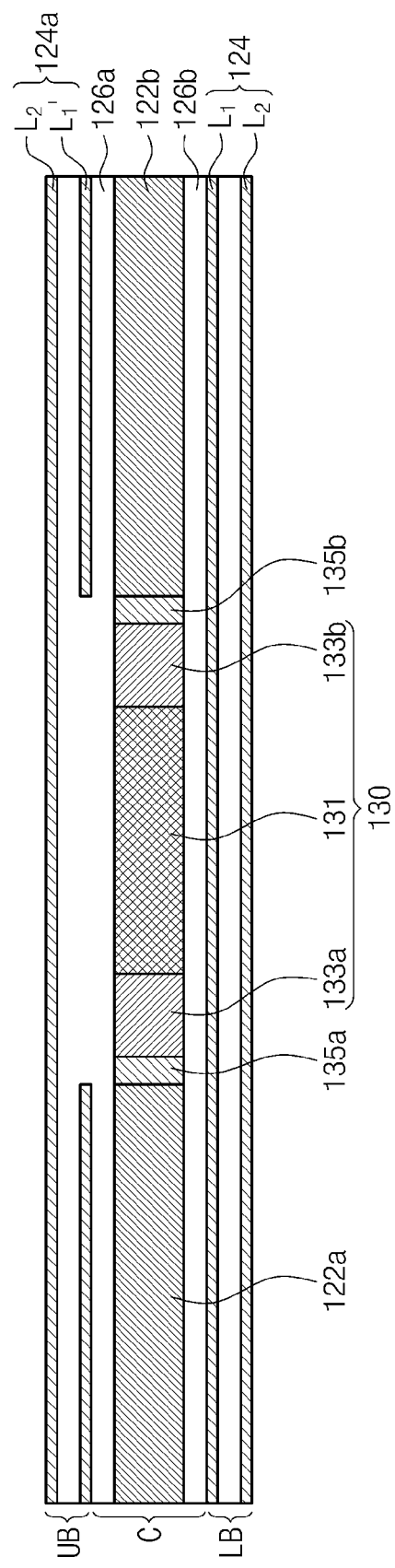

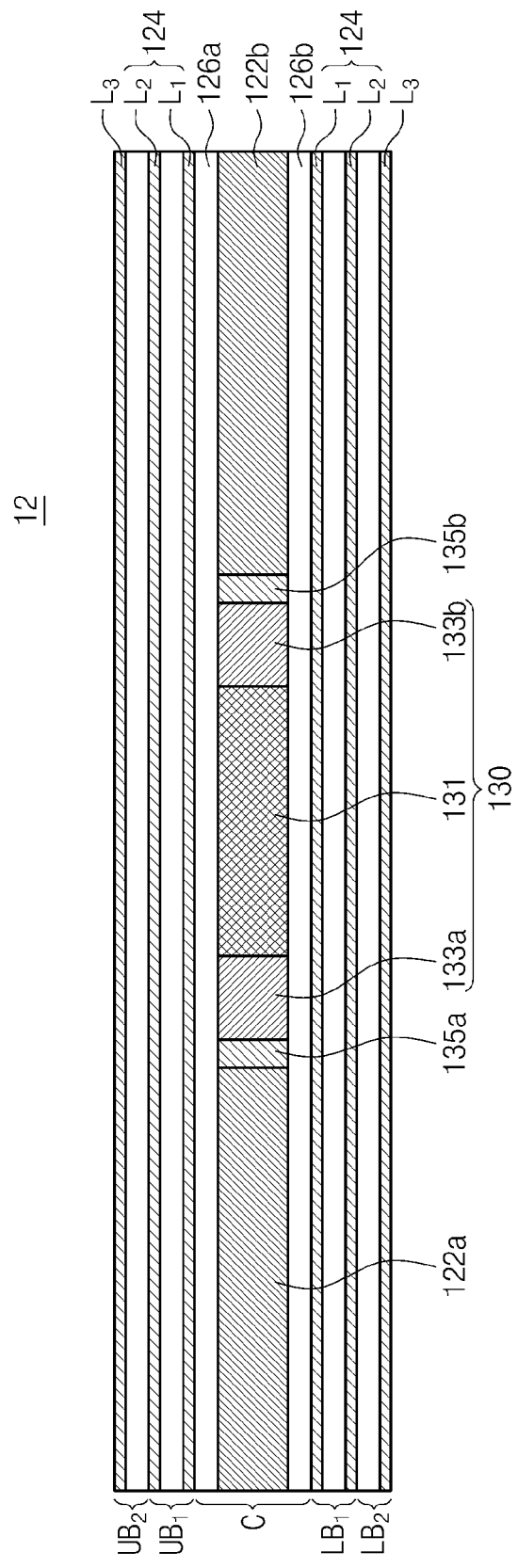

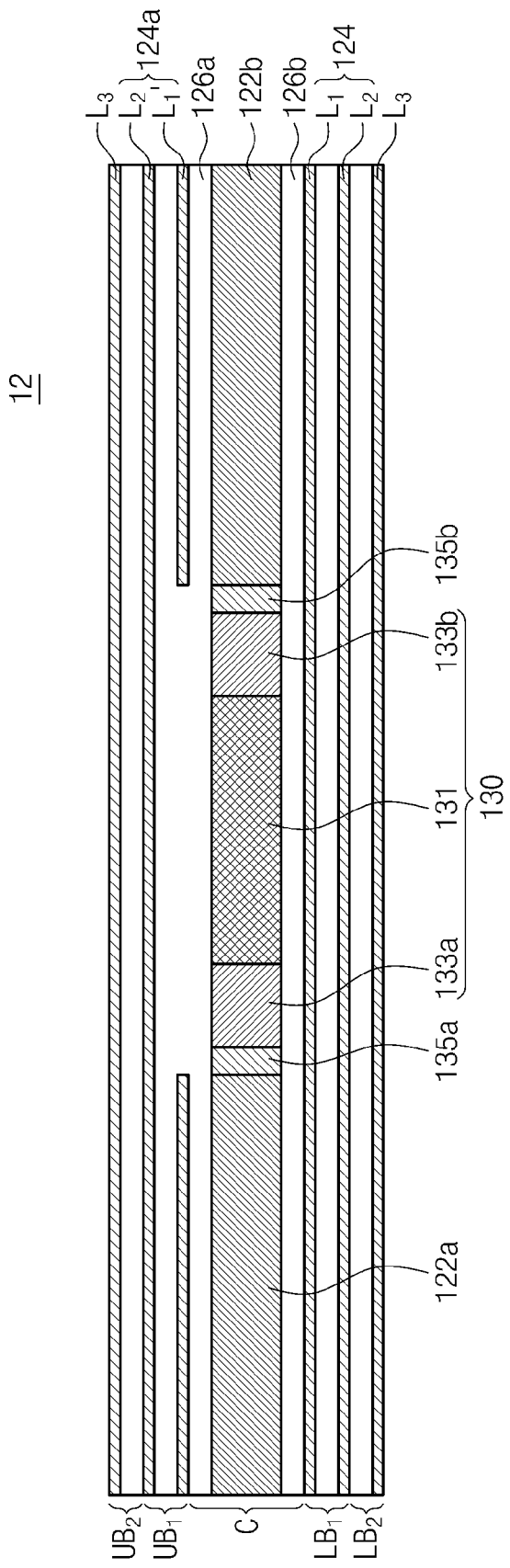

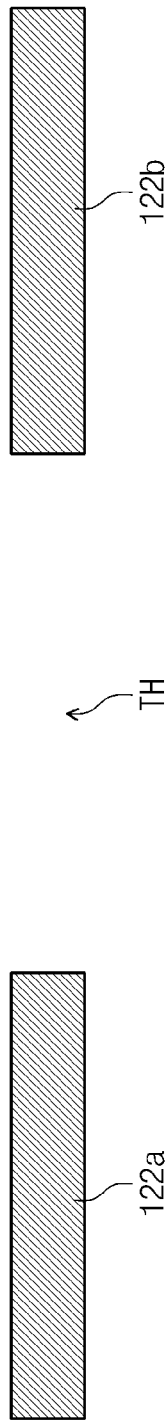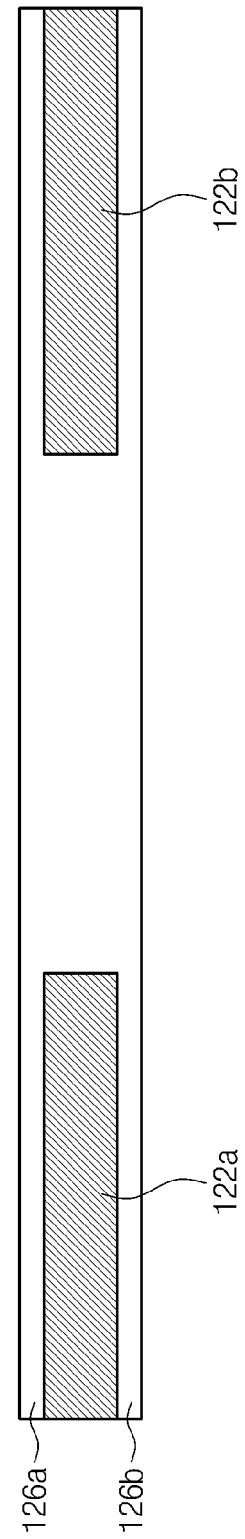

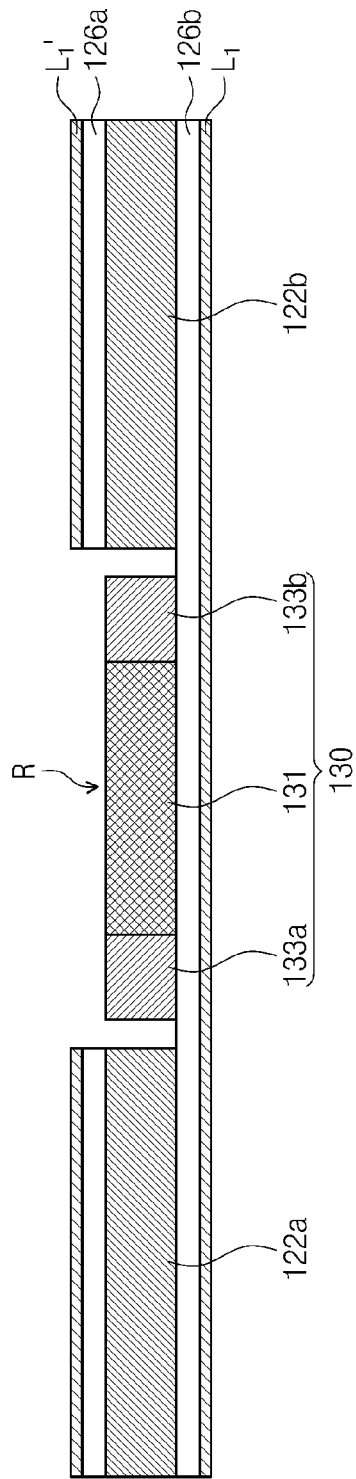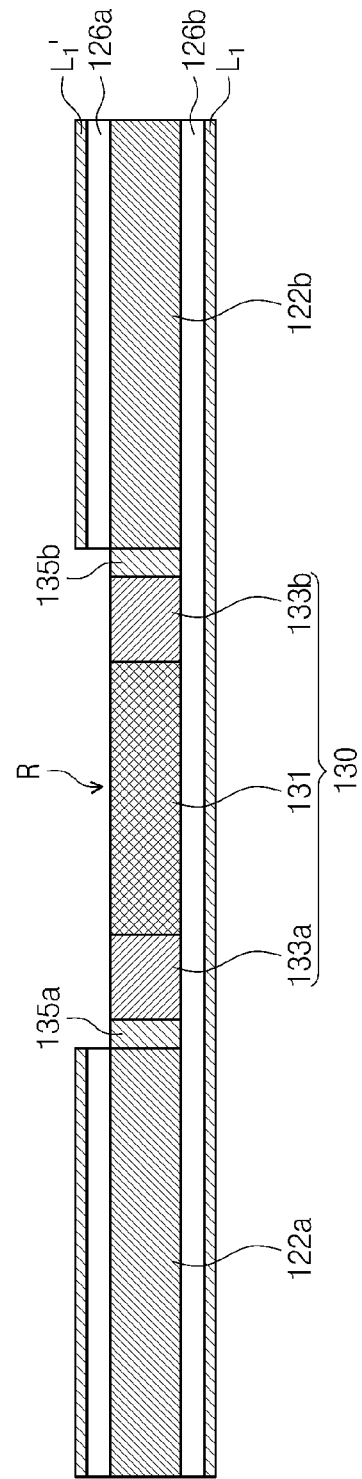

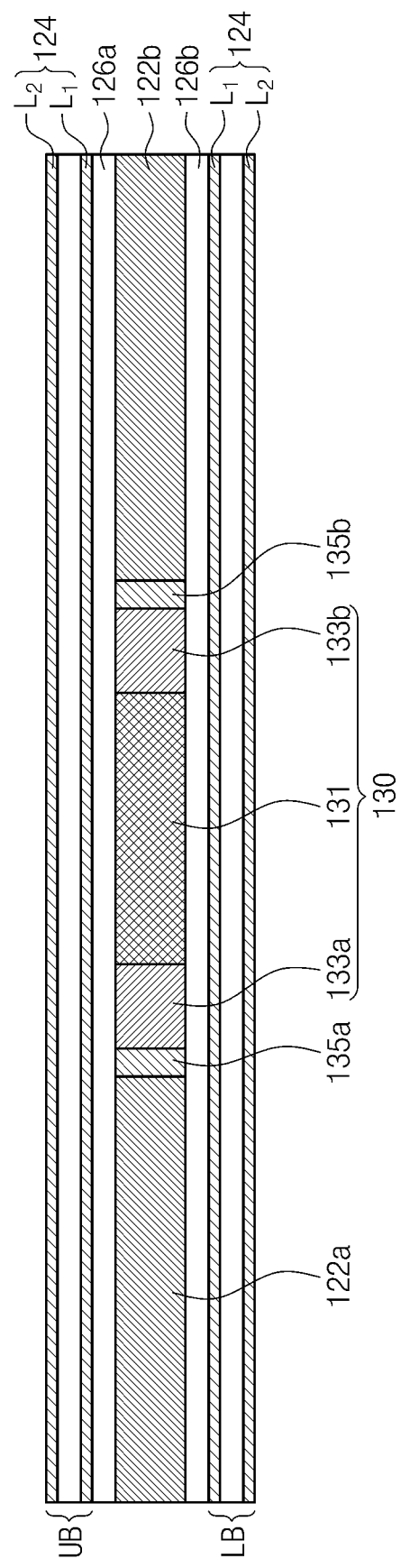

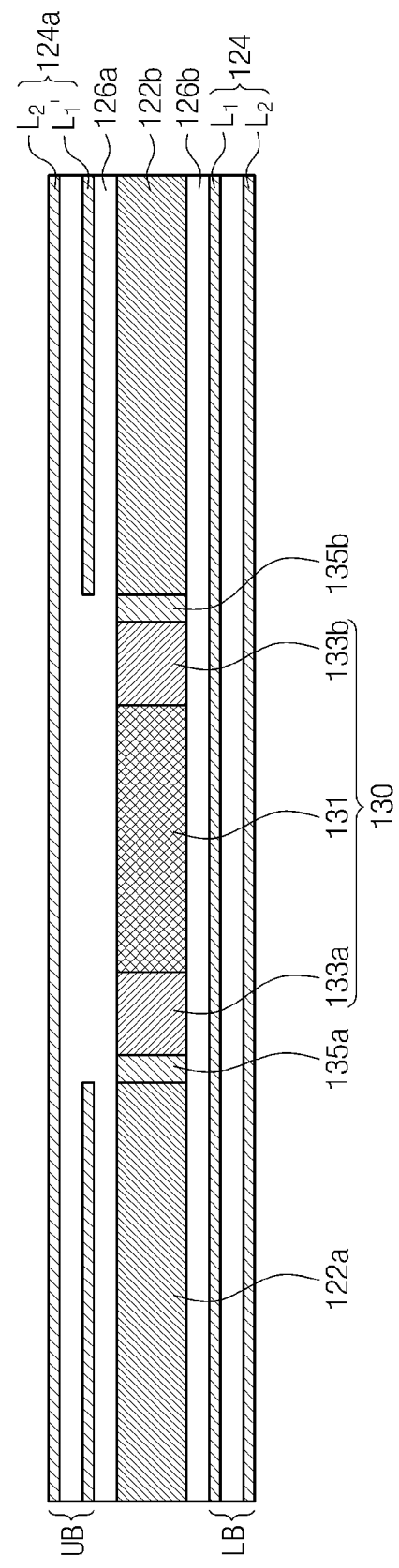

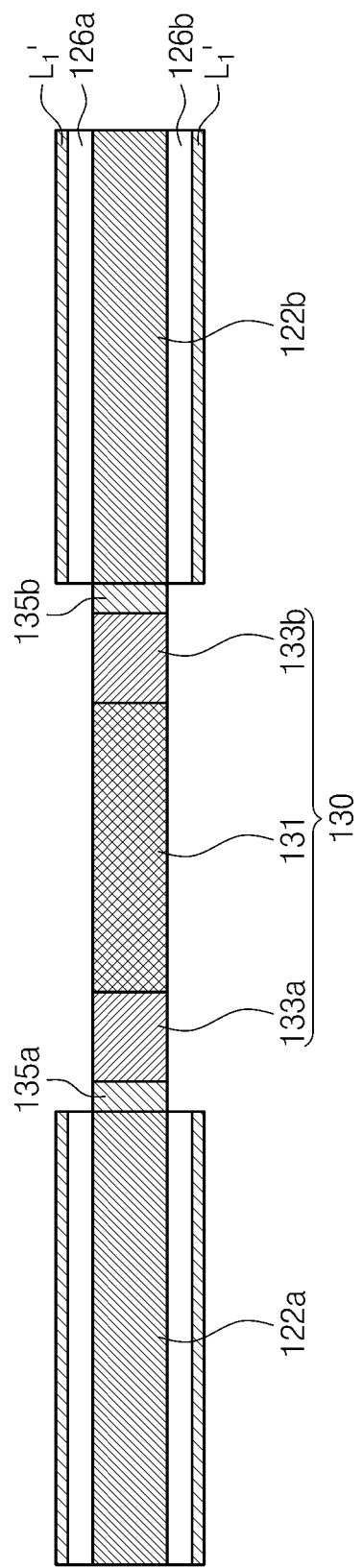

CIRCUIT BOARD AND SEMICONDUCTOR MODULE INCLUDING THE SAME

CROSS-REFERENCE TO RELATED APPLICATIONS

This U.S. non-provisional patent application claims priority under 35 U.S.C. §119 to Korean Patent Application No. 10-2010-0089045, filed on Sep. 10, 2010, the entire contents of which are hereby incorporated by reference.

BACKGROUND

The present disclosure relates to a circuit board and a semiconductor module including the same, and more particularly, to semiconductor module including a circuit board connected to a semiconductor package such as a flip chip package.

A semiconductor module may include a semiconductor package and a circuit board on which the semiconductor package is mounted. A capacitor may be mounted on a semiconductor package and a circuit board. A capacitor mounted on a circuit board may have an embedded structure. Typically, an electric potential is applied to capacitor electrodes in a circuit board through a via pattern. However, deterioration of capacitor characteristics may occur due to the via pattern. Thus, it would be beneficial to prevent deterioration of embedded capacitor characteristics in a semiconductor module that includes a circuit board and a semiconductor package.

SUMMARY

In one embodiment, a circuit board is disclosed. The circuit board includes a first metal core; a second metal core spaced apart from the first metal core in a first direction when viewed as a cross section, such that a first side of the first metal core faces a first side of the second metal core; a first electrode electrically connected to the first side of the first metal core; a second electrode electrically connected to the first side of the second metal core facing the first metal core; and a dielectric layer between the first and second electrodes.

In another embodiment, a semiconductor module is provided. The semiconductor module includes a circuit board including a first metal core, a second metal core spaced apart from the first metal core in a first direction when viewed as a cross section, a first capacitor between the first and second metal cores; a semiconductor chip mounted on the circuit board, and a connection pattern electrically connecting the semiconductor chip and the circuit board. The first capacitor may include a first electrode electrically connected to a side of the first metal core, a second electrode electrically connected to a side of the second metal core and a dielectric layer between the first and second electrodes.

In another embodiment, a circuit board is disclosed. The circuit board includes a substrate including a first metal core section and a second metal core section, wherein a first side surface of the first metal core section is spaced apart from and faces a first side surface of the second metal core section; a first electrode electrically connected to the first side surface of the first metal core section; a second electrode electrically connected to the first side surface of the second metal core section; and a dielectric layer disposed between the first electrode and the second electrode in the first direction. The first electrode, dielectric layer, and second electrode form a capacitor disposed between the first metal core section and the second metal core section.

BRIEF DESCRIPTION OF THE FIGURES

The foregoing and other features and advantages of the disclosure will be apparent from the more particular description of various embodiments, as illustrated in the accompanying drawings in which like reference characters refer to the like parts throughout the different views. The drawings are not necessarily to scale, emphasis instead being placed upon illustrating the principles of the disclosed embodiments. In the drawings, the thickness of layers and regions are exaggerated for clarity.

FIG. 1A is a cross sectional view illustrating a semiconductor module in accordance with certain exemplary embodiments.

FIG. 2A is a cross sectional view illustrating a circuit board in accordance with another exemplary embodiment.

FIG. 3A is a cross sectional view illustrating a circuit board in accordance with another exemplary embodiment.

FIG. 3B is a cross sectional view illustrating a circuit board in accordance with yet another exemplary embodiment.

FIGS. 4A through 4G are cross sectional views illustrating a method of manufacturing a circuit board in accordance with certain exemplary embodiments.

FIG. 5 is cross sectional view illustrating a method of manufacturing a circuit board in accordance with certain exemplary embodiments.

FIGS. 7A through 7C are cross sectional views illustrating a method of manufacturing a circuit board in accordance with certain exemplary embodiments.

DETAILED DESCRIPTION OF THE EMBODIMENTS

Figure 1B:
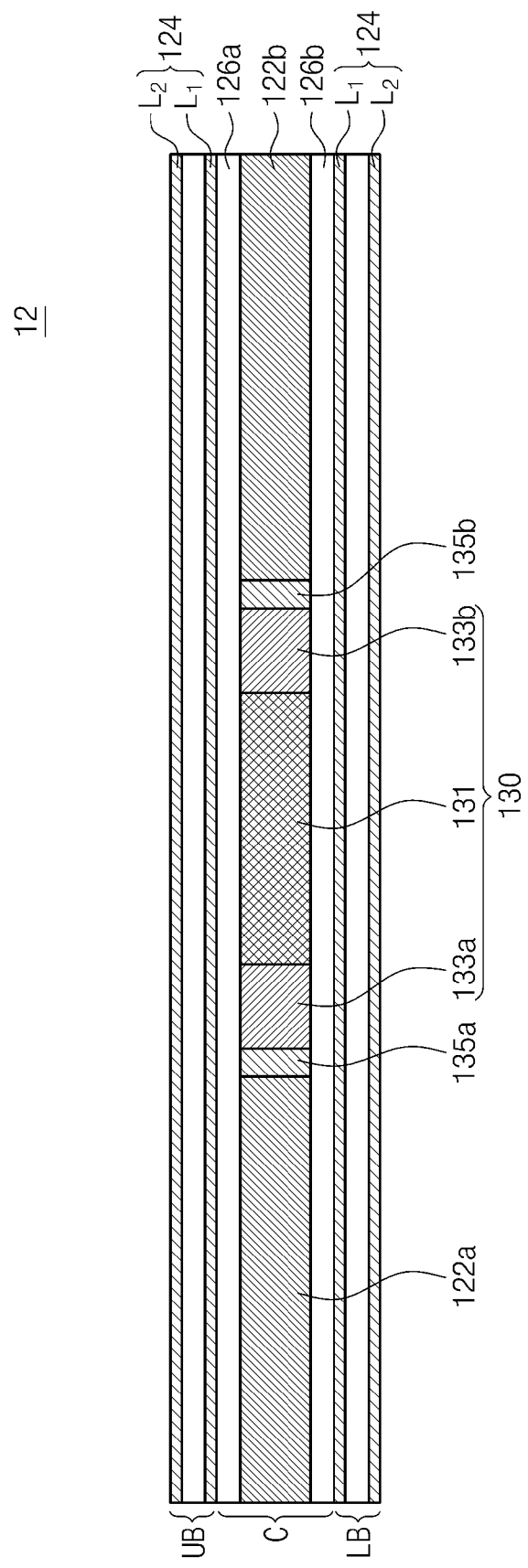
FIG. 1B is a cross sectional view illustrating a circuit board of the semiconductor module of FIG. 1A, in accordance with certain exemplary embodiments.

Embodiments will be described below in more detail with reference to the accompanying drawings. The embodiments may, however, be embodied in different forms and should not be constructed as limited to the embodiments set forth herein.

In the drawings, the thickness of layers and regions are exaggerated for clarity. It will also be understood that when an element such as a layer, region or substrate is referred to as being "on" or "onto" another element, it may lie directly on the other element or intervening elements or layers may also be present.

Embodiments may be described with reference to cross-sectional illustrations, which are schematic illustrations of idealized embodiments. As such, variations from the shapes of the illustrations, as a result, for example, of manufacturing techniques and/or tolerances, are to be expected. Thus, disclosed embodiments should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the of the disclosed embodiments.

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Terms such as "same," "planar," or "coplanar," as used herein when referring to orientation, location, shapes, sizes, amounts, or other measures do not necessarily mean an exactly identical orientation, location, shape, size, amount, or other measure, but are intended to encompass nearly identical orientation, location, shapes, sizes, amounts, or other measures within acceptable variations that may occur, for example, due to manufacturing processes.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly. Hereinafter, embodiments of the inventive concept will be described in detail with reference to drawings.

Semiconductor Module_First Embodiment

Figure 1C:
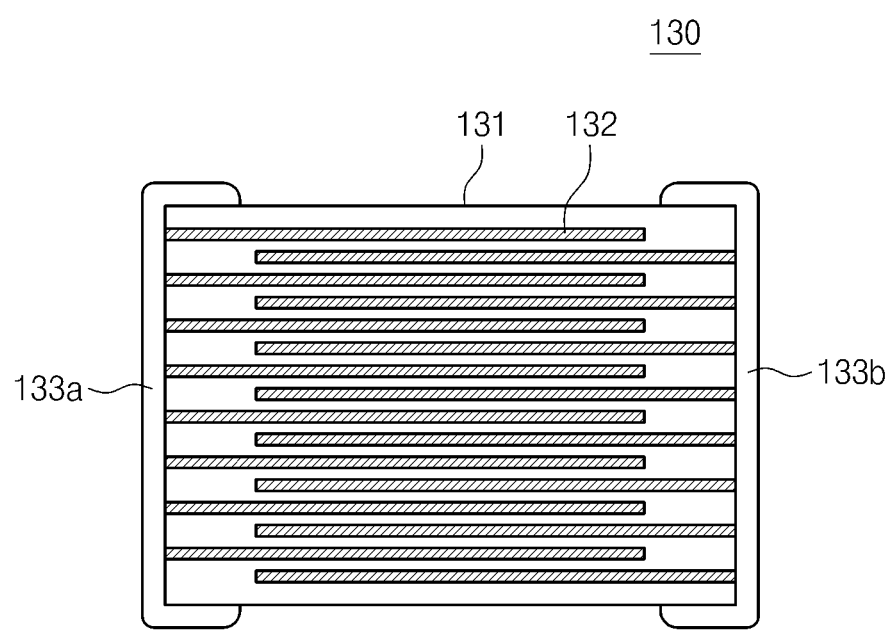
FIG. 1C is a cross sectional view illustrating a second capacitor of the semiconductor module of FIG. 1A, in accordance with certain exemplary embodiments.

FIG. 1A is a cross sectional view illustrating a semiconductor module in accordance with certain exemplary embodiments. FIG. 1B is a cross sectional view illustrating a circuit board of the semiconductor module of FIG. 1A, in accordance with certain embodiments. FIG. 1C is a cross sectional view illustrating a second capacitor of the semiconductor module of FIG. 1A, in accordance with certain embodiments.

Referring to FIGS. 1A through 1C, a semiconductor module 10 includes a semiconductor package 11 and a circuit board 12. The semiconductor package 11 is mounted on the circuit board 12. The semiconductor package 11 may be electrically connected to the circuit board 12 through a connection pattern 115 including, for example, one or more connection terminals.

Referring to FIG. 1A, the semiconductor package 11 includes a package board 110 and a semiconductor chip 100 mounted on the package board 110. However, the semiconductor package disclosed herein may include greater or fewer elements. For example, a semiconductor package 11 may include a plurality of semiconductor chips mounted on a package board to form a multi-chip package, or may include a plurality of packages that together form a package-on-package device.

The semiconductor chip 100 may be disposed on a first surface 110a of the package board 110, such as a surface opposite the surface on which connection pattern 15 is disposed. According to one embodiment, the semiconductor chip 100 is disposed on the center of the package board 110. According to other embodiments, however, the semiconductor chip 100 may be disposed near an edge of the package board 110. The package board may include a package substrate having different circuit elements included therein.

A plurality of first circuit patterns 116 may be disposed in the package board 110. These first circuit patterns may correspond to, for example, memory arrays, or logic. A predetermined electric potential may be applied to the first circuit patterns 116.

In one embodiment, first pad 102 is formed on the semiconductor chip 100. A second pad 112 may be formed to be adjacent to the semiconductor chip 100 on the face 110a of the package board 110. The first pad 102 and the second pad 112 may be electrically connected to each other. As a result, in one embodiment, the package board 110 and the semiconductor chip 100 are electrically connected to each other.

A first capacitor 114 may be disposed on the first surface 110a of the package board 110, using, for example, surface mount technology (SMT). In one embodiment, the first capacitor 114 includes a dielectric film 114b interposed between two electrodes 114a and 114b. The two electrodes 114a and 114b may be electrically connected to the first circuit patterns 116. For instance, one electrode 114a may be electrically connected to the first circuit pattern 116 to which a ground electric potential is applied and the other electrode 114b may be electrically connected to the first circuit pattern 116 to which a power electric potential being applied to the package board 110 is applied. The power electric potential being applied to the package board 110 may include an electric potential which the semiconductor package 11 can drive.

A third pad 118 may be disposed on a second surface 110b of the package board 110 opposite the first surface 110a. The third pad 118 may be electrically connected to one of the connection terminals of the connection pattern 115.

The connection pattern 115 may electrically connect the package board 110 and the circuit board 12. According to some embodiments, each connection terminal of the connection pattern 115 may include a conductive material and may be a solder bump or solder ball. A size of the semiconductor package 11 may be reduced by using a solder bump as the connection pattern 115.

According to another embodiment, a semiconductor chip 100 (or a stack of semiconductor chips 100) may be directly mounted on the circuit board 12 by the connection pattern 115, without including a package substrate such as package board 110. The semiconductor chips may be, for example, memory chips or logic chips.

Referring to FIGS. 1A and 1B, the circuit board 12 includes a core portion C of a substrate, a second capacitor 130 disposed in the core portion C, an upper buildup portion UB disposed on a top surface of the core portion C and a lower buildup portion LB disposed on a bottom surface of the core portion C.

The core portion C may extend in a specific direction when viewed as a cross-section. In one embodiment, the core portion C includes a first metal core 122a (i.e. a first core section of the substrate), a second metal core 122b (i.e., a second core section substrate) and upper and lower insulating films 126a and 126b covering the first and second metal cores 122a and 122b. Although the core portion C is described as having first and second metal cores 122a and 122b, other conductive materials may be used. The upper and lower insulating films 126a and 126b may be considered part of the core portion C, but may alternatively be considered part of respective upper buildup portion UB and lower buildup portion LB. In the embodiment described above, two metal cores 122a and 122b are illustrated. However, the inventive concept does not limit a quantity of separate sections of the metal core portion C. For example, additional capacitors may be disposed in core portion C.

Each of the first metal core 122a and the second metal core 122b may extend in the same, direction (i.e., a first direction) as the core portion C, when viewed as a cross-section. A side of the first metal core 122a may be disposed to be spaced apart from the side of the second metal core 122b in the first direction, and side surfaces of the first metal core 122a and the second metal core 122b may face each other in the first direction.

The first metal core 122a may be formed, for example, from a metal such as stainless steel, aluminum, nickel, magnesium, zinc, tantalum, or an alloy thereof. In one embodiment, the second metal core 122b may be formed from the same metal as the metal forming the first metal core 122a. For instance, the second metal core 122b may also be formed from stainless steel, aluminum, nickel, magnesium, zinc, tantalum, or an alloy thereof.

In one embodiment, the second capacitor 130 is disposed between the first and second metal cores 122a and 122b in the first direction. The second capacitor 130 may include, for example, a first electrode 133a, a second electrode 133b, and a dielectric layer 131 interposed between the first and second electrodes 133a and 133b. The second capacitor 130 may extend in a second direction perpendicular to the first direction through the entire substrate, or may extend in the second direction only through a portion of the substrate.

According to exemplary embodiments, the second capacitor 130 may be a multilayer ceramic capacitor. More specifically, referring to FIG. 1C, the second capacitor 130 may include internal, ceramic dielectric layers 131, internal electrodes 132, and first and second electrodes 133a and 133b. The second capacitor 130 may have a structure in which the internal ceramic dielectric layers 131 and the internal electrodes 132 are alternately stacked. The internal electrodes 132 of odd number may be electrically and physically connected to the first electrode 133a and the internal electrodes 132 of even number may be electrically and physically connected to the second electrode 133b, such that two adjacent internal electrodes connect to different electrodes between first electrode 133a and second electrode 133b. The first and second electrodes 133a and 133b may include, for example, metals such as silver or copper. Each of the internal electrodes 132 may be formed, for example, from metals such as silver, palladium, platinum, silver-palladium alloy, nickel, copper, or combinations thereof. The ceramic dielectric layer 131 may use, for example barium titanate ($BaTiO_3$) as a main insulating material.

Referring to FIGS. 1A and 1B, in one embodiment, the first electrode 133a is electrically connected to a side of the first metal core 122a and the second electrode 133b is electrically connected to a side of the second metal core 122b. According to certain embodiments, the first metal core 122a and the first electrode 133a are electrically and physically connected to each other by a first conductive adhesion portion 135a and the second metal core 122b and the second electrode 133b are electrically and physically connected to each other by a second conductive adhesion portion 135b.

In one embodiment, the first and second conductive adhesion portions 135a and 135b may be formed from a same material that may be different from a conductive material that forms the first and second metal cores 122a and 122b or the first and second electrodes 133a and 133b. According to one embodiment, the first and second conductive adhesion portions 135a and 135b may include an electroplating film. According to another embodiment, the first and second conductive adhesion portions 135a and 135b may include a conductive adhesive, such as a conductive paste.

A first electric potential may be applied to the first electrode 133a and a second electric potential may be applied to the second electrode 133b. According to one exemplary embodiment, the first electrode 133a is electrically connected to the first metal core 122a and therefore the first electric potential being applied to the first electrode 133a may be applied through the first metal core 122a. Similarly, the second electrode 133b may be electrically connected to the second metal core 122b and therefore the second electric potential being applied to the second electrode 133b may be applied through the second metal core 122b. For example, the first electric potential may be a ground electric potential and the second electric potential may be a power electric potential (i.e., a voltage) being applied to the circuit board 12.

The upper insulating film 126a may be disposed to cover top surfaces of the first and second metal cores 122a and 122b and a top surface of the second capacitor 130, and may contact these top surfaces. The lower insulating film 126b may be disposed to cover bottom surfaces of the first and second metal cores 122a and 122b and a bottom surface of the second capacitor 130, and may contact these bottom surfaces. According to one exemplary embodiment, top surfaces of the first and second electrodes 133a and 133b of the second capacitor 130 may be completely covered with the upper insulating film 126a. Also, bottom surfaces of the first and second electrodes 133a and 133b of the second capacitor 130 may be completely covered with the lower insulating film 126b.

Although not illustrated in detail, second circuit patterns may be disposed on the upper and lower insulating films 126a and 126b. The second circuit patterns may be electrically connected to the first and second metal cores 122a and 122b.

The upper buildup portion UB may be disposed on a top surface of the upper insulating film 126a. The lower building portion LB may be disposed on a bottom surface of the lower insulating film 126b. For example, third circuit patterns 124 may be disposed in the upper buildup portion UB and the lower building portion LB. For instance, the third circuit patterns 124 disposed in the upper buildup portion UB may be electrically connected to the package board 110 and the first and second metal cores 122a and 122b.

The third circuit patterns 124 disposed in the lower buildup portion LB may be electrically connected to the first and second metal cores 122a and 122b and an external terminal (not illustrated).

According to exemplary embodiments, the third circuit patterns 124 may include a first wiring pattern $L_1$ and a second wiring pattern $L_2$. Each wiring pattern may be configured to include conductive paths electrically connecting certain connection terminals of the package 11 to other terminals within semiconductor module 10. In one embodiment, the first and second wiring patterns $L_1$ and $L_2$ are electrically connected to each other (electrical connections not shown). Except where wiring patterns $L_1$ and $L_2$ connect, they may be separated from each other by an insulating material.

The semiconductor module 10 may further include a voltage regulation module (VRM) and a third capacitor 121.

The voltage regulation module (VRM) may be disposed on a first surface 120a of the circuit board 12. The voltage regulation module (VRM) may regulate an electric power being applied to the circuit board 12. More specifically, the voltage regulation module (VRM) may perform a function of receiving a predetermined input voltage and removing an excess voltage except the predetermined input voltage. To regulate the electric power, the voltage regulation module (VRM) may include filter devices that can regulate an input voltage automatically or manually.

The third capacitor 121 may be disposed to be adjacent to the voltage regulation module (VRM). For instance, the third capacitor 121 may be a bulk capacitor.

Typically, in the case where a second capacitor is included in the circuit board 12, via patterns would be formed that are in contact with top surfaces of two electrodes of the second capacitor respectively to apply a ground electric potential or the power electric potential of the circuit board 12 to the two electrodes through the via patterns. However, as a size of the semiconductor module 10 decreases, sizes of the two electrodes are also reduced and thereby sizes of the via patterns may become a problem. Also, in a process of forming the via patterns, problems also occur as a result of the size of a via pattern as the overall sizes of the two electrodes decrease.

According to certain exemplary embodiments, the two electrodes 133a and 133b of the second capacitor 130 may be electrically connected to sides of the first and second metal cores 122a and 122b by an electroplating or a conductive adhesive without via patterns. Thus, a size of the second capacitor 130 can be reduced depending on a size of the semiconductor package, and is not restricted based on a via size. Also, since a multilayer ceramic capacitor is used as the second capacitor 130, the second capacitor disposed in the circuit board 12 may have a smaller size and a higher capacitance. Furthermore, by avoiding using via patterns, problems occurring when forming via patterns may be prevented.

Semiconductor Module—Second Embodiment

Figure 2B:
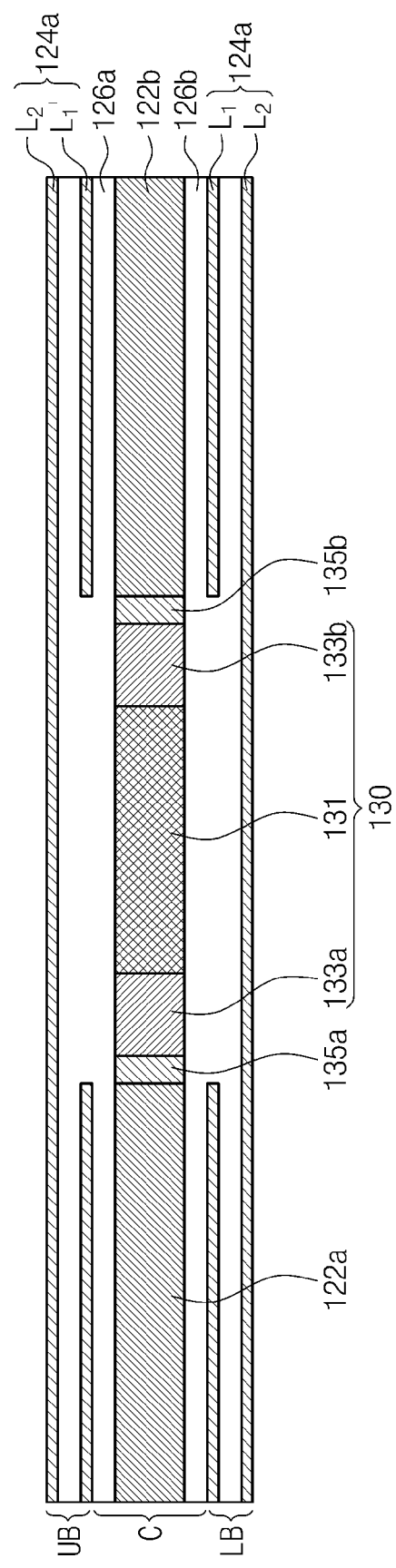
FIG. 2B is a cross sectional view illustrating a circuit board in accordance with a further exemplary embodiment.

FIG. 2A is a cross sectional view illustrating a circuit board in accordance with an exemplary embodiment. FIG. 2B is a cross sectional view illustrating a circuit board in accordance with another exemplary embodiment.

Referring to FIGS. 1A, 2A and 2B, in one embodiment, a semiconductor module 10 includes a semiconductor package 11 and a circuit board 12. The semiconductor module 10 may be the same as the semiconductor module 10 illustrated in the first embodiment of FIGS. 1A through 1C except for a structure of the circuit board 12. Therefore, the description of common features is omitted.

Referring to FIGS. 2A and 2B, the circuit board 12 may include a core portion C, a second capacitor 130, an upper buildup portion UB and a lower buildup portion LB. The core portion C may include a first metal core 122a, a second metal core 122b, and an upper insulating film 126a and lower insulating film 126b, and the second capacitor 130 may be disposed between the first and second metal cores 122a and 122b. Third circuit patterns 124 may be disposed in the upper buildup portion UB and the lower buildup portion LB. The third circuit patterns 124 may include a first wire $L_1$ and a second wire $L_2$.

Referring to FIG. 2A, according to one embodiment, a portion of the third circuit patterns 124 may be removed in the upper buildup portion UB. More specifically, the third circuit patterns 124 in the upper buildup portion UB corresponding to the position where the second capacitor 130 is disposed may be removed. A portion of the first wiring pattern $L_1$ among the third circuit patterns 124 in the upper buildup portion UB may be removed. The third circuit pattern in a state in which a portion of the first wiring pattern $L_1$ among the third circuit patterns 124 is removed is shown as a third circuit pattern 124a. The description thereof will be further explained in FIGS. 4D through 4F and 5 in detail.

Referring to FIG. 2B, according to another embodiment, a portion of the third circuit patterns 124 in the upper buildup portion UB may be removed and a portion of the third circuit patterns 124 in the lower buildup portion LB may be removed. More specifically, the third circuit patterns 124 in the upper buildup portion UB and the third circuit patterns 124 in the lower buildup portion LB corresponding to the position where the second capacitor 130 is disposed may be removed. A portion of the first wiring pattern $L_1$ among the third circuit patterns 124 in the upper buildup portion UB and a portion of the first wiring pattern $L_1$ among the third circuit patterns 124 in the lower buildup portion LB may be removed. The first wiring pattern $L_1$ in a state in which a portion of the first wiring pattern $L_1$ is removed is shown as $L_1'$. The description thereof will be further explained in FIGS. 7B and 7C in detail.

Semiconductor Module—Third Embodiment

Figure 3C:
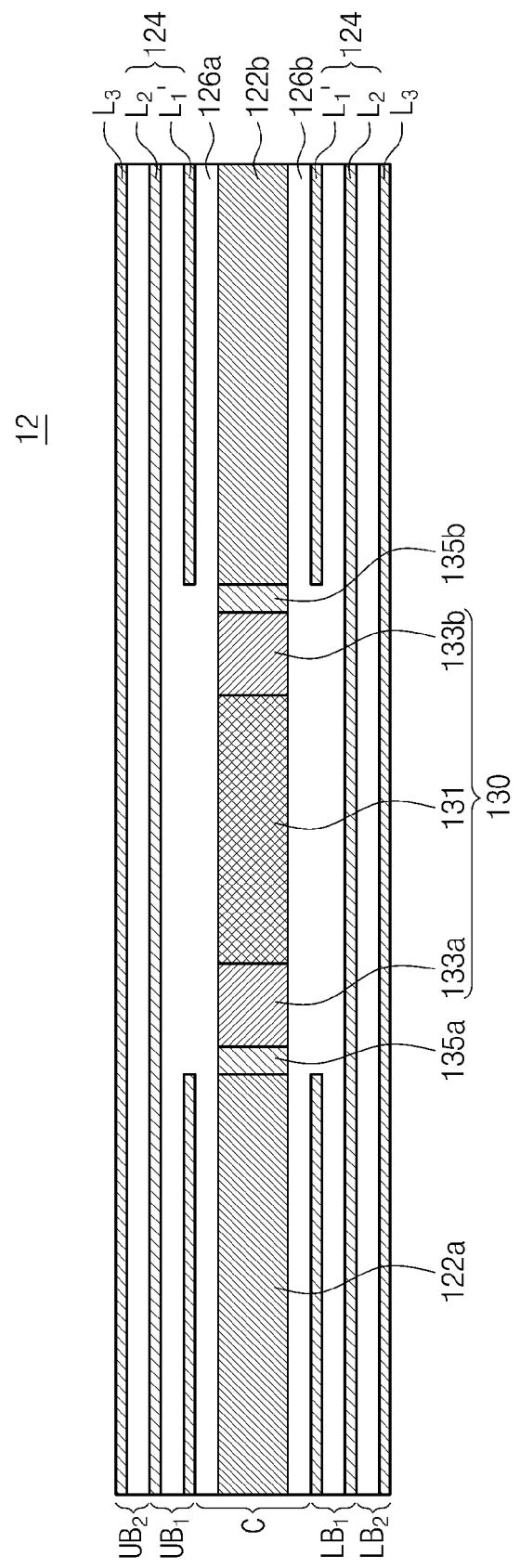
FIG. 3C is a cross sectional view illustrating a circuit board in accordance with a further exemplary embodiment.

FIG. 3A is a cross sectional view illustrating a circuit board in accordance with one exemplary embodiment. FIG. 3B is a cross sectional view illustrating a circuit board in accordance with one exemplary embodiment. FIG. 3C is a cross sectional view illustrating a circuit board in accordance with another exemplary embodiment.

Referring to FIGS. 1A, and 3A through 3C, a semiconductor module 10 may include a semiconductor package 11 and a circuit board 12. The semiconductor module 10 may be the same as the semiconductor module 10 illustrated in the first embodiment of FIGS. 1A through 1C except for a structure of the circuit board 12, and therefore the description of common features is omitted.

Referring to FIGS. 3A and 3B, the circuit board 12 may include a core portion C, a second capacitor 130, a first upper buildup portion $UB_1$, a second upper buildup portion $UB_2$, a first lower buildup portion $LB_1$, and a second lower buildup portion $LB_2$. The first upper buildup portion $UB_1$ may be disposed on a top surface of the core portion C and the second upper buildup portion $UB_2$ may be disposed on a top surface of the first upper buildup portion $UB_1$. The first lower buildup portion $LB_1$ may be disposed on a bottom surface of the core portion C and the second lower buildup portion $LB_2$ may be disposed on a bottom surface of the first lower buildup portion $LB_1$.

According to the embodiment illustrated in FIG. 3A, third circuit patterns 124 may be disposed on the first upper and lower buildup portions $UB_1$ and $LB_1$ and fourth circuit patterns 128 may be disposed on the second upper and lower buildup portions $UB_2$ and $LB_2$. The third circuit patterns 124 may include a first wiring pattern $L_1$ and a second wiring pattern $L_2$. The fourth circuit patterns may include a third wiring pattern $L_3$.

According to another embodiment illustrated in FIG. 3B, a portion of the third circuit patterns 124 in the first upper buildup portion $UB_1$ may be removed. More specifically, the third circuit patterns 124 in the first upper buildup portion $UB_1$ corresponding to the position where the second capacitor 130 is disposed may be removed. A portion of the first wiring pattern $L_1$ among the third circuit patterns 124 in the first upper buildup portion $UB_1$ may be removed. The third circuit pattern in a state in which a portion of the first wiring pattern $L_1$ among the third circuit patterns 124 is removed is shown as a third circuit pattern 124a.

Although not illustrated in detail, a portion of the first wiring pattern $L_1$ and the second wiring pattern $L_2$ of the third circuit patterns 124 in the first upper buildup portion $UB_1$ and a portion of the third wiring pattern $L_3$ of the fourth circuit patterns in the second upper buildup portion $UB_2$ may be removed. The first, second and third wiring patterns $L_1$, $L_2$ and $L_3$ corresponding to the position where the second capacitor 130 is disposed may be removed. The first, second and third wiring patterns in a state in which a portion of $L_1$, $L_2$ and $L_3$ is removed is described as $L_1'$, $L_2'$ and $L_3'$.

According to still another embodiment illustrated in FIG. 3C, a portion of the third circuit patterns 124 in the first upper buildup portion $UB_1$ may be removed and a portion of the third circuit patterns 124 in the first lower buildup portion $LB_1$ may be removed. The first wiring pattern $L_1$ of the third circuit pattern 124 in the first upper buildup portion $UB_1$ and the first wiring pattern $L_1$ of the third circuit pattern 124 in the first lower buildup portion $LB_1$ corresponding to the position where the second capacitor 130 is disposed may be removed. The third circuit pattern in a state in which a portion of the first wiring pattern $L_1$ among the third circuit patterns 124 is removed is shown as a third circuit pattern 124a. The first wire in a state in which a portion of the first wiring pattern $L_1$ is removed is shown as $L_1'$.

Although not illustrated in detail, a portion of the first wiring pattern $L_1$ and the second wiring pattern $L_2$ of the third circuit patterns 124 in the first upper and lower buildup portions $UB_1$ and $LB_1$ and a portion of the third wiring pattern $L_3$ of the fourth circuit patterns in the second upper and lower buildup portions $UB_2$ and $LB_2$ may be removed. The first, second and third wiring patterns in a state in which a portion of $L_1$, $L_2$ and $L_3$ is removed is described as $L_1'$, $L_2'$ and $L_3'$.

In the embodiment of FIGS. 3A-3C, four buildup portions are described as an example. However, the location and the quantity of the buildup portions are not limited as such.

Hereinafter, a method of manufacturing a circuit board of a semiconductor module is described. The methods that will be described below are only an illustration and various modified methods of manufacturing a circuit board may be implemented. As such, the inventive concept is not limited to the specific method of described below.

Method of Manufacturing Circuit Board—First Embodiment

Figure 6:
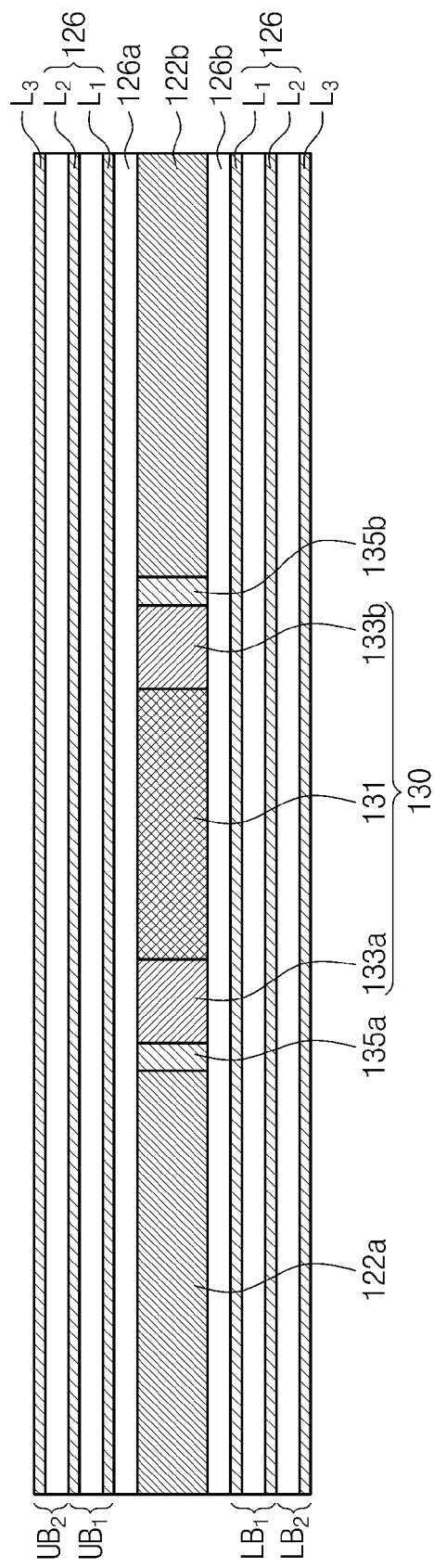
FIG. 6 is cross sectional view illustrating a method of manufacturing a circuit board in accordance with certain exemplary embodiments.

FIGS. 4A through 4G are cross sectional views illustrating a method of manufacturing a circuit board in accordance with certain exemplary embodiments. FIG. 5 is cross sectional view illustrating a method of manufacturing a circuit board in accordance with other exemplary embodiments. FIG. 6 is cross sectional view illustrating a method of manufacturing a circuit board in accordance with further exemplary embodiments.

Referring to FIG. 4A, a first metal core 122a and a second metal core 122b are formed.

According to one embodiment, a metal core board may be prepared. Through holes (TH) are then formed in the metal core board using, for example, a drill or a laser to form the first metal core 122a and the second metal core 122b.

Referring to FIG. 4B, an upper insulating film 126a may be formed on top surfaces of the first and second metal cores 122a and 122b and a lower insulating film 126b may be formed on bottom surfaces of the first and second metal cores 122a and 122b. An insulating film may also be formed between the first and second metal cores 122a and 122b. According to one embodiment, the upper and lower insulating films 126a and 126b, and the insulating film formed between the first and second metal cores 122a and 122b may be formed at the same time by a single process.

Figure 4C:
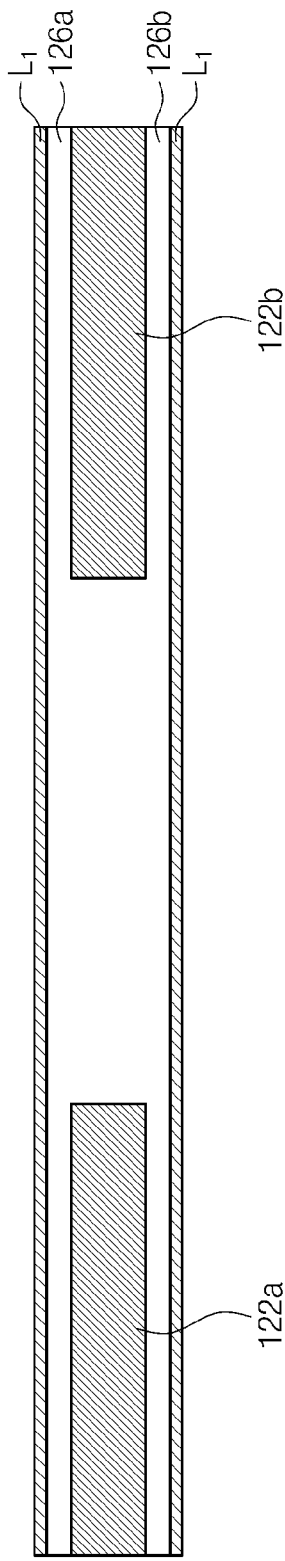

Referring to FIG. 4C, a first wiring pattern $L_1$ may be formed on a top surface of the upper insulating film 126a and a first wiring pattern $L_1$ may be formed on a bottom surface of the lower insulating film 126b. In one embodiment, the first wiring pattern $L_1$ on the top surface of the upper insulating film 126a and the first wiring pattern $L_1$ on the bottom surface of the lower insulating film 126b are formed at the same time.

Figure 4D:
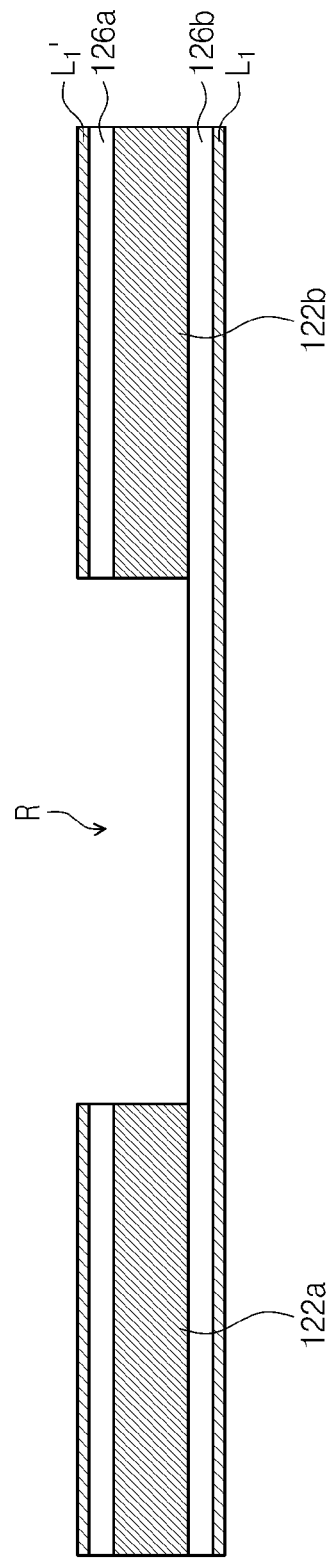

Referring to FIG. 4D, the insulating film between the first and second metal cores 122a and 122b and a portion of the first wiring pattern $L_1$ on the top surface of the upper insulating film 126a and the first insulating layer 126a are etched to form a recess R between the first and second metal cores 122a and 122b.

According to one embodiment, a side of the first metal core 122a and aside of the second metal core 122b may be exposed by the recess R, and as a result, the sides face each other.

In one embodiment, the recess R may be formed using a drill or a laser.

Referring to FIG. 4E, a second capacitor 130 is inserted into the recess R. The second capacitor 130 may be, for example, a multilayer ceramic capacitor. In one embodiment, the structure of the second capacitor 130 is the same as the capacitor 130 described in FIGS. 1A and 1B, so a detailed description of the second capacitor 130 is omitted.

Referring to FIG. 4F, first and second conductive adhesion portions 135a and 135b may be formed that electrically connect first and second electrodes 133a and 133b of the second capacitor 130 and the first and second metal cores 122a and 122b.

More specifically, the first electrode 133a of the second capacitor 130 may be electrically connected to a side of the first metal core 122a by the first conductive adhesion portion 135a. The second electrode 133b of the second capacitor 130 may be electrically connected to a side of the second metal core 122b by the second conductive adhesion portion 135b.

According to one embodiment, the first electrode 133a and the second electrode 133b are electrically connected to the first metal core 122a and the second metal core 122b respectively by an electroplating. According to another embodiment, the first electrode 133a and the second electrode 133b are electrically connected to the first metal core 122a and the second metal core 122b respectively by a conductive adhesive (e.g., a conductive paste).

Referring to FIG. 4G, the removed upper insulating film 126a and the first wiring pattern $L_1$ of an upper buildup portion UB may be formed again on the second capacitor 130. Subsequently, second wiring patterns $L_2$ are formed on the first wiring patterns $L_1$ to form the upper buildup portion UB on the upper insulating film 126a and the lower buildup portion LB on the bottom surface of the lower insulating film 126b, respectively.

According to another embodiment illustrated in FIG. 5, the removed first wiring pattern $L_1$ may not be formed in the upper buildup portion UB again. Thus, as illustrated in FIG. 5, the first wiring pattern $L_1$ in the upper buildup portion UB corresponding to the position where the second capacitor 130 is disposed may be removed.

According to still another embodiment illustrated in FIG. 6, a second upper buildup portion $UB_2$ and a second lower buildup portion LB$_2$ may be formed on the first upper buildup portion UB$_1$ and a backside of the first lower buildup portion LB$_1$, respectively. Fourth circuit patterns including a third pattern L$_3$ may be formed in the second upper and lower buildup portions UB$_2$ and LB$_2$.

Method of Manufacturing Circuit Board—Second Embodiment

Figure 7A:
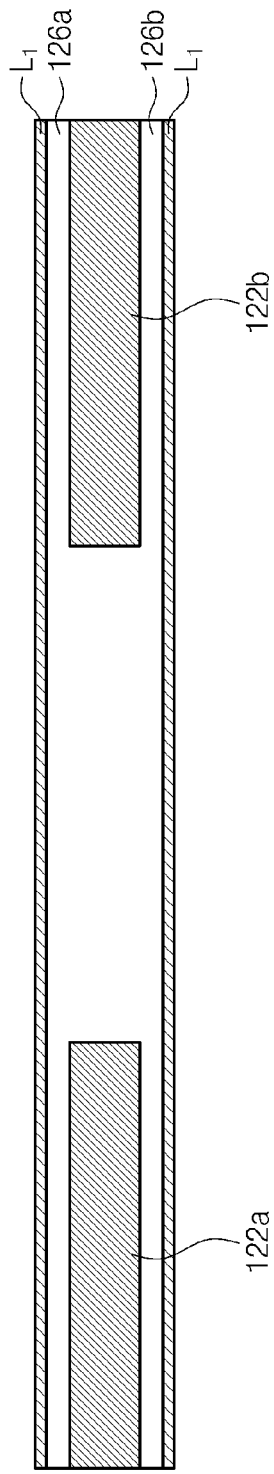
Figure 7B:
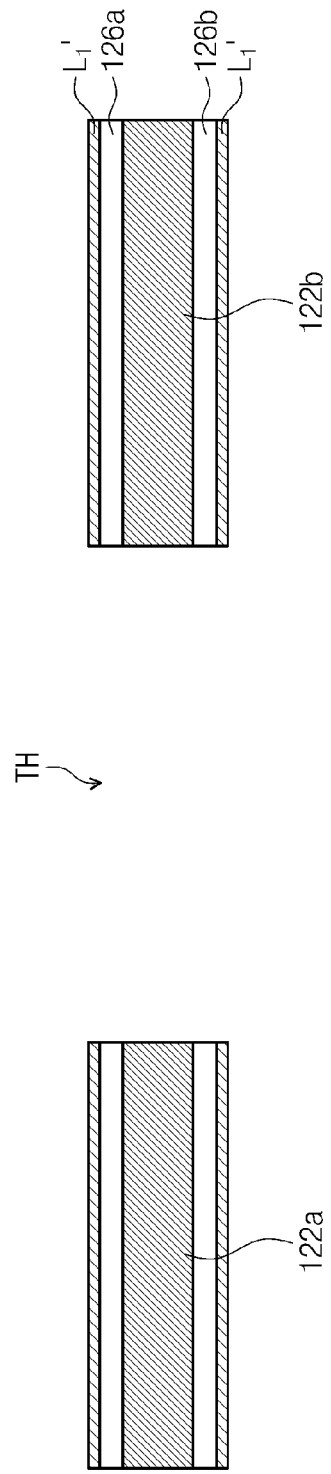

FIGS. 7A through 7C are cross sectional views illustrating a method of manufacturing a circuit board in accordance with another exemplary embodiment.

Referring to FIG. 7A, a preliminary circuit board including first and second metal cores 122a and 22b, upper and lower insulating films 126a and 126b, a first wiring pattern L$_1$ on the upper insulating film 126a and a first wiring pattern L$_1$ on the lower insulating film 126b is prepared.

Referring to FIG. 7B, a portion of the first wiring pattern L$_1$ on the upper insulating film 126a, a portion of the upper and lower insulating films 126a and 126b and a portion of the first wiring pattern L$_1$ on the lower insulating film 126b may be etched to form a through hole TH penetrating the preliminary circuit board. A side of the first metal core 122a and a side of the second metal core 122b may be exposed by the through hole TH, and may thus face each other.

Referring to FIG. 7C, the first and second metal cores 122a and 122b may be electrically connected to a second capacitor 130.

In one embodiment, subsequent processes are the substantially same as the processes described in FIGS. 4E through 4G, 5 and 6, so a further description thereof is omitted.

Figure 8A:
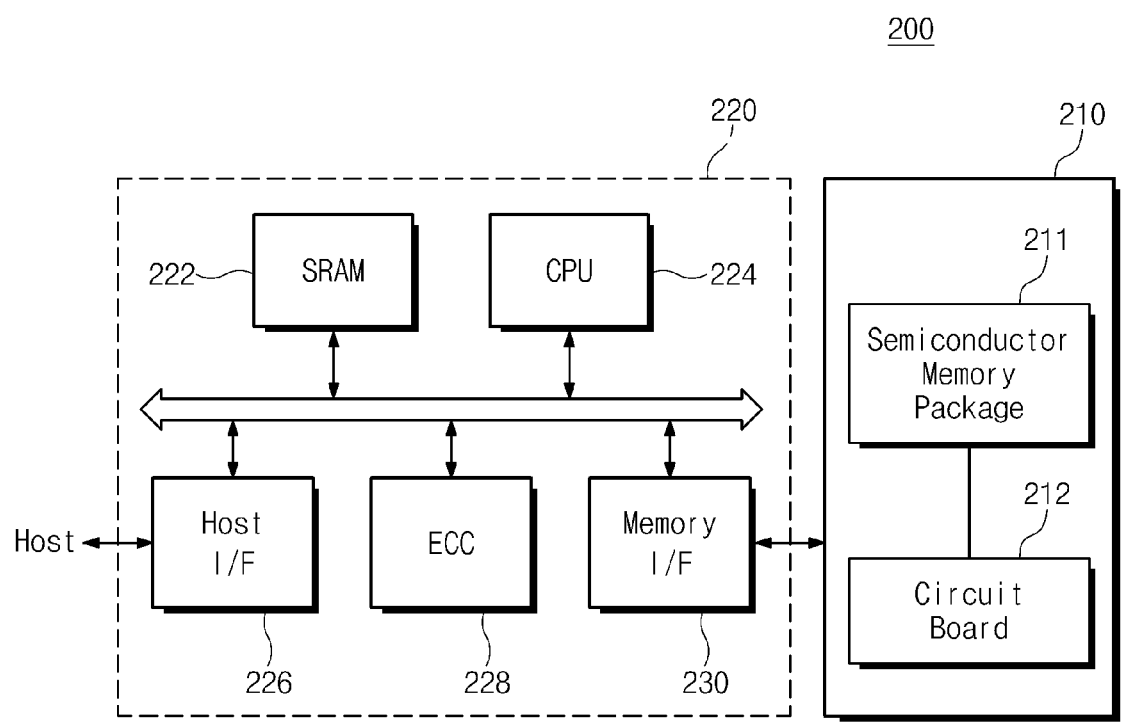
FIG. 8A is a block diagram illustrating a memory system including a semiconductor package in accordance with certain exemplary embodiments.

FIG. 8A is a block diagram illustrating a memory system including a semiconductor package in accordance with certain exemplary embodiments.

Referring to FIG. 8A, the semiconductor package and in accordance with exemplary embodiments may be applied to a memory system 200. As an illustration, the memory system 200 may include a memory controller 220 controlling all the data exchanges between a host and memory 210. Memory 210 may include, for example, a semiconductor memory package 211 and a circuit board 212, such as described in the various embodiments above. The semiconductor memory package 211 may be a specific type of memory, for example EEPROM, NAND flash, DRAM, etc. A SRAM 222 may be used as an operation memory of a central processing unit 224. A host interface 226 may include data exchange protocols of the host connected to the memory system 200. An error correction block 228 may detect and correct errors included in data readout from the semiconductor memory package 211. A memory interface 230 interfaces with the memory 210. The central processing unit 224 performs all the control operations for a data exchange of the memory controller 220.

By including the embodiments disclosed herein, the memory 210 applied to the memory system 200 may an improved integration. Also, abnormal processes that can occur when a capacitor is built in a circuit board may be prevented.

Figure 8B:
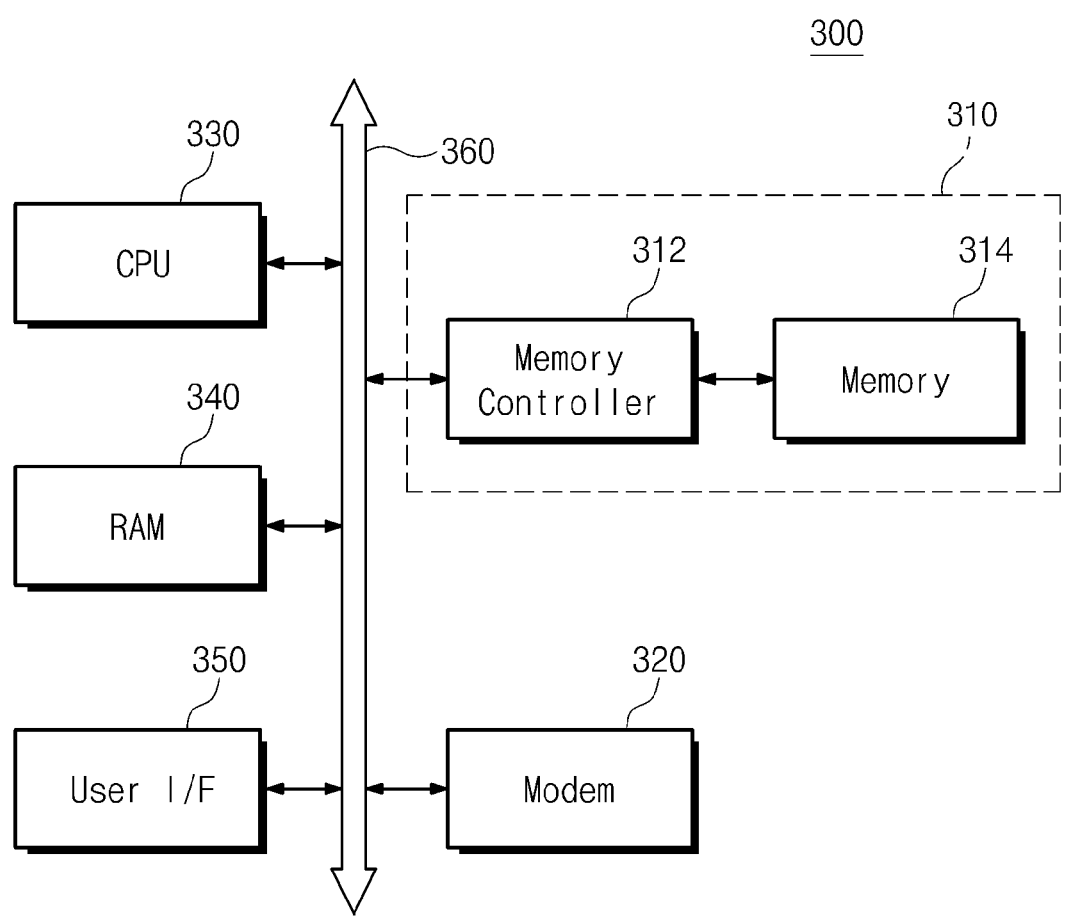
FIG. 8B is a block diagram illustrating an exemplary system to which a semiconductor package in accordance with exemplary embodiments is applied.

FIG. 8B is a block diagram illustrating an information processing system to which a memory device in accordance with exemplary embodiments is applied.

Referring to FIG. 8B, an information processing system 300 may include a semiconductor memory device, for example, a memory system 310 including a resistive variable memory. The information processing system 300 may include, for example, a mobile device (e.g., cell phone, laptop PDA, personal media player, camera, etc.) or other computer (e.g., desktop computer). As an illustration, the information processing system 300 may include a memory system 310 and a modem 320, a central processing unit 330, a RAM 340 and a user interface that are electrically connected to a system bus 360. The memory system 310 may include data processed by the central processing device 330 or data received from an external device. The memory system 310 may include a memory 314 and a memory controller 312 and may implemented, for example, using the memory system 200 described with reference to FIG. 8A. The information processing system 300 may be provided by a solid state disk (SSD), a camera image sensor and an application chip set, for example. The information processing system 300 may stably and reliably store large amounts of data in the memory system 310.

According to exemplary embodiments, a capacitor built in a circuit board is directly connected to sides of metal cores and thereby a smaller semiconductor device can be manufactured. Also, a capacitor is directly connected to the metal cores and thereby process and technical problems occurring during a formation of via patterns may be prevented. Furthermore, by using a multilayer ceramic capacitor as a capacitor built in the circuit board, the capacitor may have a large capacitance while having a small size.

Although a few embodiments of the present disclosure have been shown and described, it will be appreciated by those skilled in the art that changes may be made in these embodiments without departing from the principles and spirit of the present disclosure, the scope of which is defined in the appended claims and their equivalents. Therefore, the above-disclosed subject matter is to be considered illustrative, and not restrictive.

What is claimed is:

1. A circuit board comprising:
   a metal core including a first metal core and a second metal core spaced apart from the first metal core in a first direction when viewed as a cross section, such that a first side of the first metal core faces a first side of the second metal core, wherein the first metal core is a solid metal core, and the second metal core is a solid metal core;
   a first electrode electrically connected to the first side of the first metal core;
   a second electrode electrically connected to the first side of the second metal core facing the first metal core;
   a dielectric layer between the first and second electrodes;
   a first conductive adhesion portion electrically connecting the first side of the first metal core and the first electrode;
   a first insulating layer covering and contacting the conductive surface of the metal core; and
   a second conductive adhesion portion electrically connecting the first side of the second metal core and the second electrode,
   wherein the dielectric layer, first electrode, and second electrode form a capacitor electrically connected to the first metal core and second metal core through the first conductive adhesion portion and second conductive adhesion portion respectively.

2. The circuit board of claim 1, wherein the first and second conductive adhesion portions include an electroplating film.

3. The circuit board of claim 1, wherein the first and second conductive adhesion portions include a conductive adhesive.

4. The circuit board of claim 1, wherein the first and second conductive adhesion portions include a conductor different from the first and second metal cores and the first and second electrodes.

5. The circuit board of claim 1, further comprising:
an upper insulating film that forms the first insulating layer and that is in contact with an entire portion of top surfaces of the first and second electrodes;
a lower insulating film that is in contact with an entire portion of bottom surfaces of the first and second electrodes;
an upper buildup portion on an upper portion of the upper insulating film; and
a lower buildup portion on a lower portion of the lower insulating film.

6. The circuit board of claim 5, wherein the upper and lower buildup portions include circuit patterns wherein a circuit pattern on a position corresponding to the first and second electrodes and the dielectric layer is removed.

7. The circuit board of claim 5, wherein the upper and lower buildup portions respectively have a multilayer structure.

8. The circuit board of claim 1, wherein the capacitor is further configured to receive a first electric potential applied to the first metal core and a second electric potential different from the first electric potential applied to the second metal core.

9. The circuit board of claim 1, wherein the dielectric layer includes ceramic.

10. The circuit board of claim 1, wherein the first and second metal cores and the first and second electrodes include different conductive materials from one another.

11. A semiconductor module comprising:
a circuit board including a metal core including a first metal core and a second metal core spaced apart from the first metal core in a first direction when viewed as a cross section, and a first capacitor between the first and second metal cores;
a semiconductor chip mounted on the circuit board;
a first insulating layer covering and contacting a conductive surface of the metal core; and
a connection pattern electrically connecting the semiconductor chip and the circuit board,
wherein the first capacitor includes a first electrode electrically connected to a side of the first metal core through a first conductive adhesion portion, a second electrode electrically connected to a side of the second metal core through a second conductive adhesion portion, and a dielectric layer between the first and second electrodes.

12. The semiconductor module of claim 11, further comprising:
a voltage regulation module on the circuit board; and
a second capacitor disposed adjacent to the voltage regulation module on the circuit board.

13. The semiconductor module of claim 11, further including a package board between the circuit board and the semiconductor chip.

14. The semiconductor module of claim 13, wherein the semiconductor chip is mounted on the package board, and further comprising a third capacitor disposed adjacent to the semiconductor chip on the package board.

15. The semiconductor module of claim 11, wherein the connection pattern is a solder bump.

16. A circuit board comprising:
a substrate including a metal core including a first metal core section and a second metal core section, wherein a first side surface of the first metal core section is spaced apart from and faces a first side surface of the second metal core section;
a first electrode electrically connected to the first side surface of the first metal core section through a first conductive adhesive directly connected between the first electrode and the first side surface of the first metal core section;
a second electrode electrically connected to the first side surface of the second metal core section through a second conductive adhesive directly connected between the second electrode and the second side surface of the second metal core section;
a first insulating layer covering and contacting a conductive surface of the metal core; and
a dielectric layer disposed between the first electrode and the second electrode in the first direction,
wherein the first electrode, dielectric layer, and second electrode form a capacitor disposed between the first metal core section and the second metal core section.

17. The circuit board of claim 16, wherein the first and second conductive adhesion portions include one of an electroplating film and a conductive adhesive.

18. The circuit board of claim 16, wherein the dielectric layer comprises:
a plurality of first internal electrodes connected to the first electrode;
a plurality of second internal electrodes connected to the second electrode; and
dielectric layers that physically separate each of the first internal electrodes and second internal electrodes from each other.

* * * * *